United States Patent
Ogino

(10) Patent No.: US 7,990,518 B2
(45) Date of Patent: Aug. 2, 2011

(54) IMMERSION EXPOSURE APPARATUS AND DEVICE MANUFACTURING METHOD

(75) Inventor: Kaoru Ogino, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 429 days.

(21) Appl. No.: 12/239,074

(22) Filed: Sep. 26, 2008

(65) Prior Publication Data

US 2009/0091717 A1 Apr. 9, 2009

(30) Foreign Application Priority Data

Oct. 5, 2007 (JP) .................................. 2007-262732

(51) Int. Cl.
*G03B 27/52* (2006.01)
(52) U.S. Cl. ......................................................... 355/30
(58) Field of Classification Search .................... 355/53, 355/30, 77, 72
See application file for complete search history.

(56) References Cited

U.S. PATENT DOCUMENTS

| 5,969,441 | A * | 10/1999 | Loopstra et al. | ........... | 310/12.06 |
| 7,505,115 | B2 | 3/2009 | Magome et al. | | |
| 2005/0243293 | A1* | 11/2005 | Hara et al. | ........ | 355/53 |
| 2006/0132737 | A1 | 6/2006 | Magome et al. | ................ | 355/53 |
| 2006/0146305 | A1 | 7/2006 | Magome et al. | ................ | 355/53 |
| 2006/0209280 | A1 | 9/2006 | Makita et al. | .................... | 355/53 |
| 2007/0076183 | A1 | 4/2007 | Hara et al. | ........................ | 355/53 |
| 2007/0164234 | A1 | 7/2007 | Tsuji et al. | ................. | 250/491.1 |

FOREIGN PATENT DOCUMENTS

| JP | 2005-79480 | 3/2005 |
| JP | 2005-268742 | 9/2005 |
| JP | 2006-179761 | 7/2006 |
| JP | 2006-319242 | 11/2006 |
| KR | 10-2006-0052882 A | 5/2006 |
| WO | WO 2005/022615 | 3/2005 |
| WO | WO 2005/069355 | 7/2005 |

OTHER PUBLICATIONS

English translation of Japanese Patent Laid-Open No. 2006-179761.
English translation of Japanese Patent Laid-Open No. 2005-79480.
English translation of Japanese Patent Laid-Open No. 2006-319242.
Korean Office Action dated Jul. 8, 2010, which issued in counterpart Korean patent application No. 10-2008-0096941.

* cited by examiner

*Primary Examiner* — Edward J Glick
*Assistant Examiner* — Deoram Persaud
(74) *Attorney, Agent, or Firm* — Fitzpatrick, Cella, Harper & Scinto

(57) ABSTRACT

An immersion exposure apparatus that projects a pattern of an original onto a substrate via a projection optical system and a liquid, thereby exposing the substrate. A substrate stage mechanism includes a substrate stage to hold the substrate. An immersion unit supplies the liquid into a space between the substrate or the substrate stage and the projection optical system, and recovers the liquid from above the substrate or the substrate stage. A control unit controls the immersion unit to recover the liquid from above the substrate or the substrate stage, and then controls the substrate stage mechanism to move the substrate stage to a retreat position, in response to a shutoff request for requesting shutoff of electrical power supply to the substrate stage mechanism. The control unit executes, in response to the shutoff request, a special process according to a process being executed by the immersion exposure apparatus when the control unit has received the shutoff request, and then controls the immersion unit to recover the liquid from above the substrate stage.

8 Claims, 4 Drawing Sheets

IMMERSION EXPOSURE APPARATUS AND DEVICE MANUFACTURING METHOD

This application claims the benefit of Japanese Patent Application No. 2007-262732, filed Oct. 5, 2007, which is hereby incorporated by reference herein in its entirety.

BACKGROUND OF THE INVENTION

1. Field of the Invention

The present invention relates to an immersion exposure apparatus, which projects a pattern of an original onto a substrate via a projection optical system and a liquid, thereby exposing the substrate, and a method of manufacturing a device using the immersion exposure apparatus.

2. Description of the Related Art

Along with the advance of the micropatterning of semiconductor devices, exposure light sources are shifting from high-pressure mercury lamps (for example, g-line and i-line) to ones that emit light beams having shorter wavelengths, such as a KrF excimer laser and an ArF excimer laser. To obtain a higher resolving power, it is necessary to increase the NA (numerical aperture) of the projection optical system, so that the depth of focus is further decreasing. The relationship among these factors can be generally expressed by:

$$(\text{resolving power}) = k_1(\lambda/NA)$$

$$(\text{depth of focus}) = \pm k_2(\lambda/NA2)$$

where $\lambda$ is the wavelength of the exposure light, NA is the numerical aperture of the projection lens, and $k_1$ and $k_2$ are coefficients that depend on the process involved.

As techniques for increasing the resolving power and the depth of focus, a phase shift mask and modified illumination have already been studied and put to practical use. As another technique for increasing the resolving power and the depth of focus, an immersion exposure technique is known. The immersion exposure technique performs exposure by filling the interval between the substrate surface (image plane) and the end face of the projection optical system with a liquid having a high refractive index.

The interval between the image plane and the end face of the projection is called a working distance. In a conventional dry exposure apparatus, the working distance is filled with, e.g., air. The working distance is usually set to 10 mm or more for convenience of accommodating an auto focus system in the apparatus. In the immersion exposure apparatus, however, the working distance is reduced to 3 mm or less. This increases the probability that the projection optical system and the substrate stage that holds the substrate will come into mechanical contact with each other, as compared with the dry exposure apparatus.

Still worse, when the liquid that fills the working distance leaks out due to some cause, this may exert an adverse influence on, e.g., electronic devices or mechanisms in the exposure apparatus. When the liquid leaks out or the projection optical system and the substrate stage come into mechanical contact with each other, huge amounts of time are required for maintenance until recovery, resulting in deterioration in productivity.

Especially, assume that electrical power supply to the substrate stage mechanism is shut off due to some cause during the operation of the exposure apparatus. In this case, for example, the liquid may remain in the working distance, the liquid may leak out thereafter, or the projection optical system and the substrate stage may come into mechanical contact with each other.

To solve these problems, the following techniques have been proposed as measures to prevent, when electrical power supply to the substrate stage mechanism is shut off due to some cause, such liquid leakage and mechanical contact between the projection optical system and the substrate stage. Japanese Patent Laid-Open No. 2005-079480 discloses a proposal of forming a liquid recovery groove on the substrate stage in advance, and tilting the substrate stage so that the liquid flows into the recovery groove if an emergency such as an electrical power failure occurs. Japanese Patent Laid-Open No. 2005-268742 discloses a proposal of stopping liquid supply if an emergency such as an electrical power failure occurs, and specifying a liquid leakage portion by a liquid leakage detection mechanism, thereby preventing the adverse influence of the liquid leakage on, e.g., other peripheral electronic devices. Japanese Patent Laid-Open No. 2006-179761 discloses a proposal of providing a plurality of power supply systems.

However, in the technique described in Japanese Patent Laid-Open No. 2005-079480, the substrate stage must be tilted very largely by taking account of the physical properties (e.g., the affinity) of the substrate and the liquid. In addition, the probability that the projection optical system and the substrate stage will come into mechanical contact with each other still remains. The technique described in Japanese Patent Laid-Open No. 2005-268742 is effective in reducing the adverse influence exerted by the liquid leakage, but cannot prevent the liquid leakage itself and mechanical contact between the projection optical system and the substrate stage. Japanese Patent Laid-Open No. 2006-179761 does not disclose how to control the substrate stage when electrical power supply from the main power supply is shut off.

SUMMARY OF THE INVENTION

The present invention has been made on the basis of the recognition of the above-described problems, and has as its object to suppress liquid leakage and contact between a projection optical system and a substrate stage due to, e.g., shut-off of electrical power supply in an immersion exposure apparatus.

According to the present invention, there is provided an immersion exposure apparatus that projects a pattern of an original onto a substrate via a projection optical system and a liquid, thereby exposing the substrate, comprising a substrate stage mechanism including a substrate stage configured to hold the substrate, an immersion unit configured to supply the liquid into a space between the substrate or the substrate stage and the projection optical system, and to recover the liquid from above the substrate or the substrate stage, and a control unit configured to control the immersion unit to recover the liquid from above the substrate or the substrate stage, and then to control the substrate stage mechanism to move the substrate stage to a retreat position, in response to a shutoff request for requesting shutoff of electrical power supply to the substrate stage mechanism.

According to the present invention, it is possible to suppress liquid leakage and contact between a projection optical system and a substrate stage due to, e.g., shutoff of electrical power supply in an immersion exposure apparatus.

Further features of the present invention will become apparent from the following description of exemplary embodiments with reference to the attached drawings.

DESCRIPTION OF THE EMBODIMENT

A preferred embodiment of the present invention will be described below with reference to the accompanying drawings.

Figure 1:
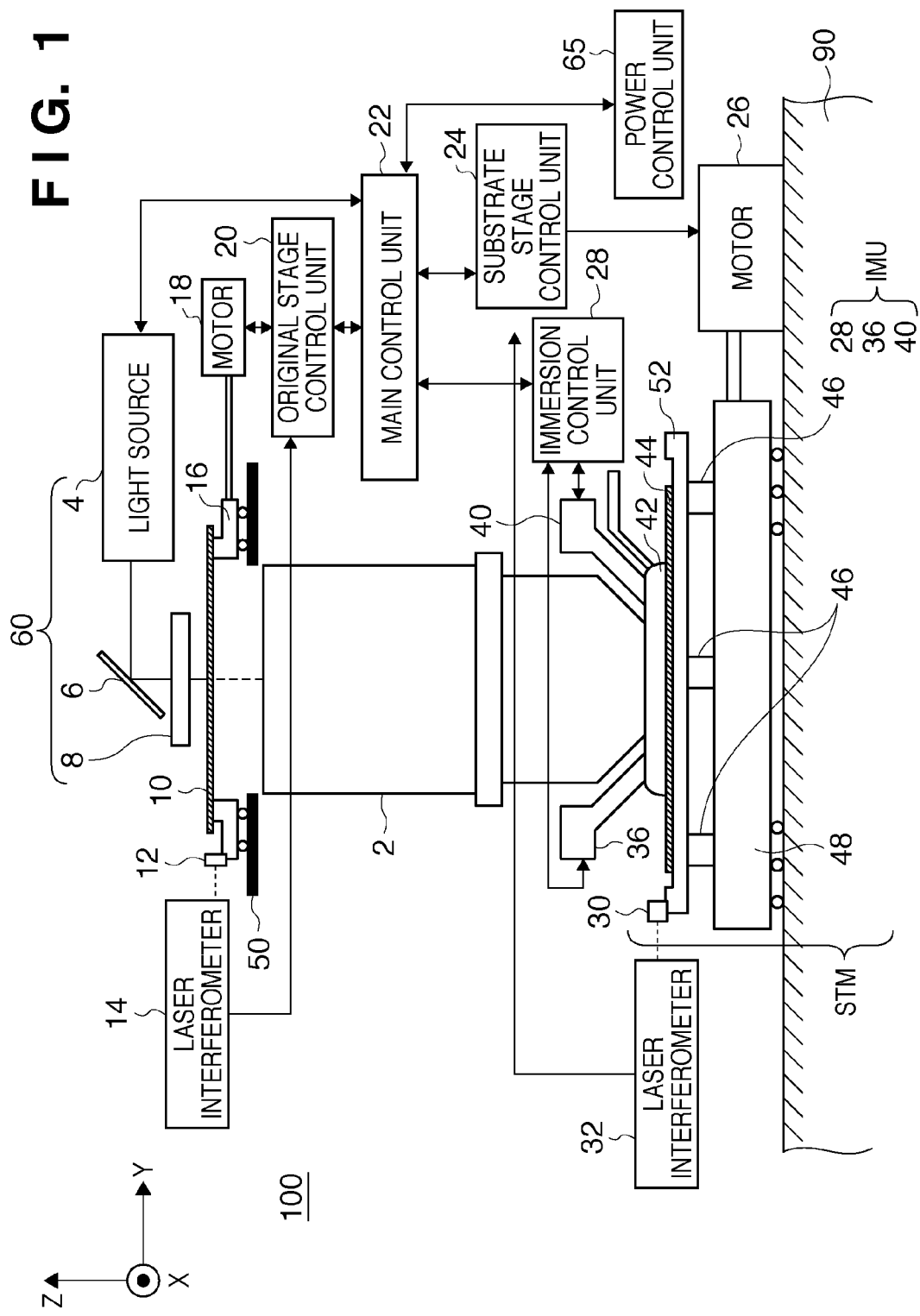
FIG. 1 is a block diagram schematically showing the arrangement of an immersion exposure apparatus according to a preferred embodiment of the present invention.

FIG. 1 is a block diagram schematically showing the arrangement of an immersion exposure apparatus according to a preferred embodiment of the present invention. Although an example in which the immersion exposure apparatus according to the present invention is applied to a scanner will be explained herein, the present invention is also applicable to a stepper.

An immersion exposure apparatus 100 according to a preferred embodiment of the present invention projects the pattern of an original (also called a reticle or mask) 10 onto a substrate (wafer) 44 via a projection optical system 2 and a liquid 42, thereby exposing the substrate 44. The substrate 44 is coated with a photosensitive agent. A latent image pattern is formed on the photosensitive agent by exposure. The projection optical system 2 has, e.g., a circular image field of view formed of the telecentric system on its object (original) side, and has, e.g., a circular image field of view formed of the telecentric system on its image (substrate) side. In exposing each shot region on the substrate 44, the original 10 and substrate 44 are scan-driven relative to the projection optical system 2.

An illumination system 60 can comprise, e.g., a light source 4, a beam expander (not shown), an optical integrator (not shown), a mirror 6, a collimator lens system 8, an illumination field stop (not shown), and a relay optical system (not shown).

The light source 4 can be, e.g., an ArF excimer laser light source, which emits pulse light having a wavelength of about 193 nm. The beam expander shapes the sectional shape of the light emitted by the light source 4. The optical integrator is, e.g., a fly-eye lens and forms a secondary source image upon receiving the shaped light. The collimator lens system 8 converges the light from the secondary source image to form illumination light having a uniform illuminance distribution. The illumination field stop shapes the illumination light into a rectangle having its long side in a direction perpendicular to the scanning direction in scanning exposure. The relay optical system images the rectangular opening of the illumination field stop on the original 10 in cooperation with the mirror 6 and collimator lens system 8.

The original 10 is supported by a vacuum suction force by an original stage 16. The original stage 16 is driven at a constant speed in one axial direction with a large stroke during scanning exposure. The original stage 16 is supported by an original stage base 50.

The position and rotation of the original stage 16 on the x-y plane are continuously measured by a laser interferometer 14. The laser interferometer 14 emits a laser beam toward a mirror (plane mirror or corner mirror) attached on the original stage 16, and receives the laser beam reflected by the mirror 12. An original stage control unit 20 controls a motor (e.g., a linear motor) 18, which drives the original stage 16, on the basis of the x-y position measured by the laser interferometer 14.

While a certain portion of the pattern region on the original 10 is illuminated with the shaped illumination light, the exposure light emerging from the illuminated pattern portion is projected onto the photosensitive agent (photoresist), which is applied on the substrate 44, via the projection optical system (e.g., a ¼ reduction projection optical system) 2, and forms an image on it. The optical axis of the projection optical system 2 is aligned to match that of the illumination system 60.

The projection optical system 2 comprises a plurality of lens elements (optical elements). These elements can be made of, e.g., two different materials such as quartz and fluorite having high transmittances for ultraviolet light (exposure light) having a wavelength of 193 nm. The fluorite is mainly used to form a lens element having a positive power. The space in the lens barrel on which the lens elements of the projection optical system 2 are fixed can be filled with nitrogen gas to suppress the absorption of the exposure light by oxygen. The optical path from the inside of the light source 4 to the collimator lens system 8 can be similarly filled with nitrogen gas. The projection optical system 2 may include a mirror.

Figure 2:
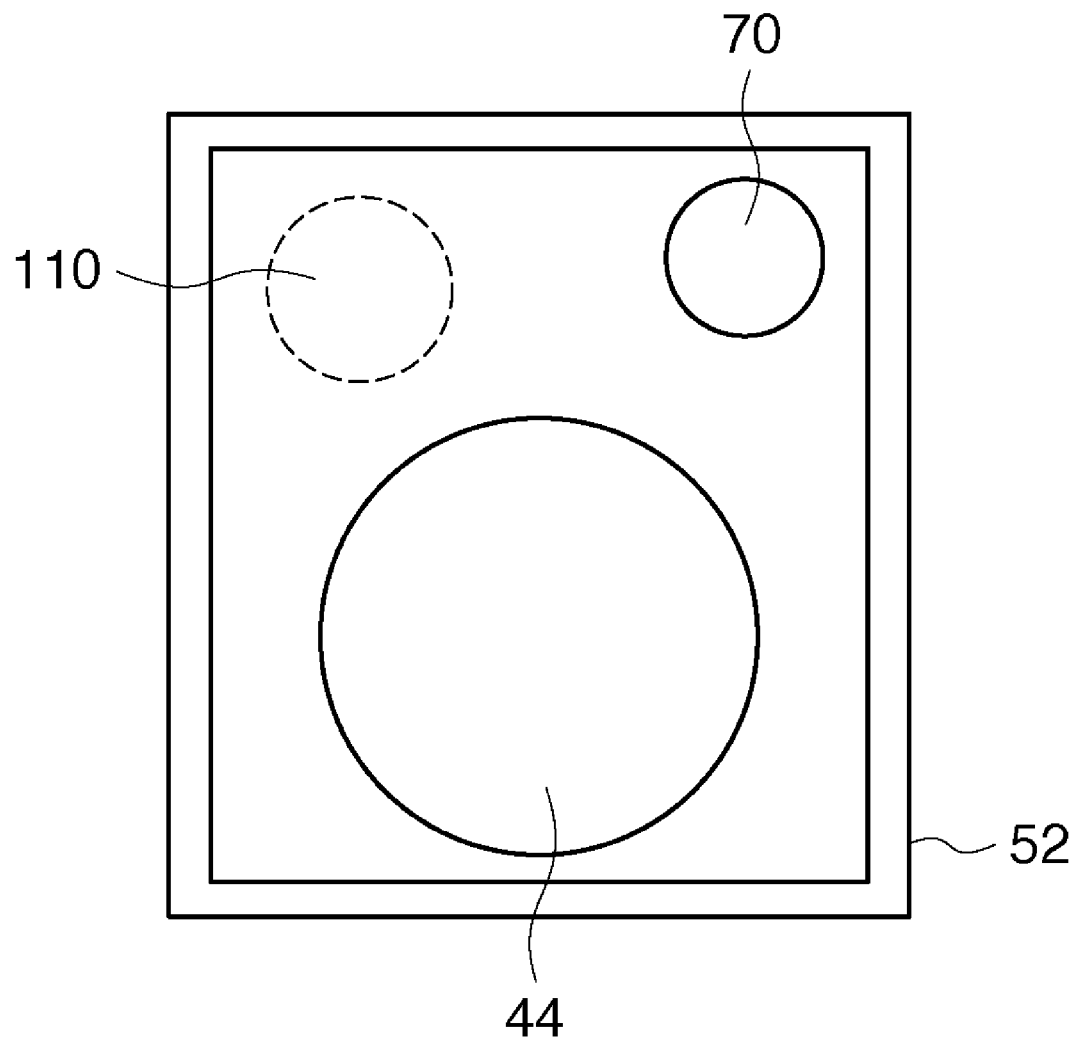
FIG. 2 is a schematic view when a substrate stage is viewed from above.

The substrate 44 is aligned or driven by a substrate stage mechanism STM including a substrate stage (ZT stage) 52 which holds the substrate 44. FIG. 2 is a schematic view when the substrate stage 52 is viewed from above. The substrate stage 52 comprises a substrate chuck (not shown), which holds the substrate 44. The substrate stage 52 adjusts, e.g., the position of the substrate 44 in the z direction along the optical axis of the projection optical system 2, and the tilt of the substrate 44 with respect to the x-y plane perpendicular to the z direction. The substrate stage 52 can be attached on an X-Y stage 48 through, e.g., a plurality of (e.g., three) Z actuators 46.

The Z actuators 46 each can be formed by combining, e.g., a piezoelectric element, a voice coil motor or a DC motor, and a lift/cam mechanism. When all the Z actuators 46 drive the substrate stage 52 by the same amount in the z direction, the substrate stage 52 is translated in the z direction (i.e., the direction in which focusing is performed), parallel to the X-Y stage 48. When the Z actuators 46 drive the substrate stage 52 by different amounts in the z direction, the tilt amount and tilt direction of the substrate stage 52 are adjusted.

The X-Y stage 48 is driven two-dimensionally, i.e., in the x and y directions on a substrate stage base 90. The X-Y stage 48 is two-dimensionally driven by a plurality of motors 26. The motors 26 can be formed from, e.g., a DC motor which rotates a feed screw, and/or a linear motor which produces a driving force in a non-contact state. A substrate stage control unit 24 controls the motors 26. The substrate stage control unit 24 is provided with information on the position of the substrate stage 52 in the x and y directions by a laser interferometer 32. The laser interferometer 32 emits a laser beam toward a mirror 30 arranged on the substrate stage 52, and receives the laser beam reflected by the mirror 30.

A liquid film is formed in the space between the substrate 44 and the end face of the projection optical system 2 by the liquid 42. The pattern of the original 10 is projected onto the substrate 44 via the liquid 42, in addition to the projection optical system 2.

An immersion unit IMU controls the supply of the liquid 42 into the space between the substrate 44 or the substrate stage 52 and the end face of the projection optical system 2, and the recovery of the liquid 42 from above the substrate 44 or the substrate stage 52. The immersion unit IMU can include, e.g., a liquid supply unit 36, a liquid recovery unit 40, and an immersion control unit 28. The liquid supply unit 36 supplies the liquid 42 into the space between the substrate 44 or substrate stage 52 and the end face of the projection optical system 2 in response to a command from the immersion control unit 28. The liquid recovery unit 40 recovers the liquid 42 from above the substrate 44 or substrate stage 52 in response to a command from the immersion control unit 28.

A power control unit 65 controls electrical power supply to the above-described constituent elements of the immersion exposure apparatus 100. The power control unit 65 can individually control electrical power supply to, e.g., a substrate driving system including the substrate stage mechanism STM, the illumination system 60, and a main control unit 22.

Figure 3:
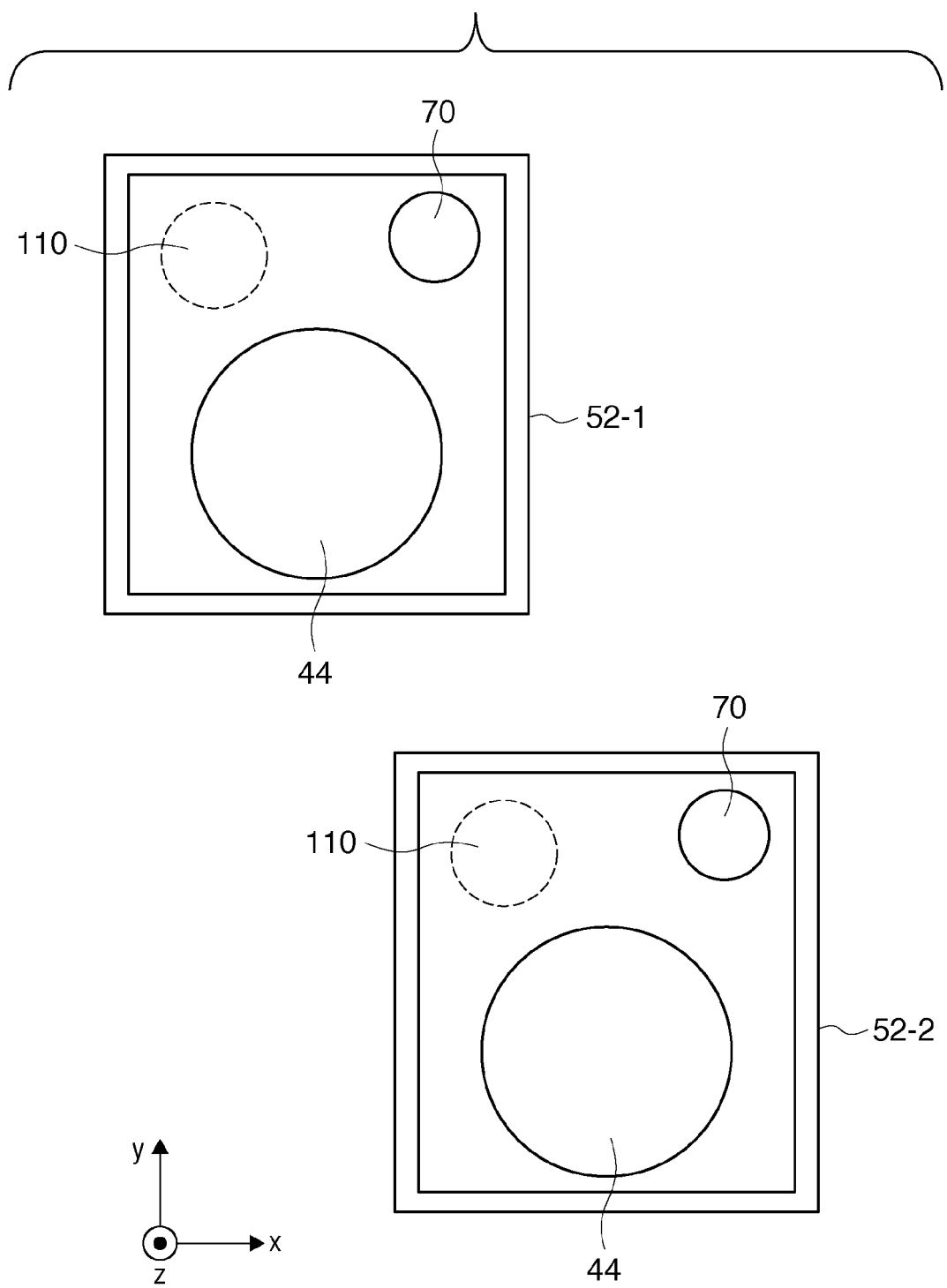
FIG. 3 is a schematic view when substrate stages of a twin-stage configuration are viewed from above.

The immersion exposure apparatus 100 is also applicable to an exposure apparatus in which the substrate stage mechanism has a twin-stage configuration. FIG. 3 is a schematic view when two substrate stages 52-1 and 52-2 used when the substrate stage mechanism STM of the immersion exposure apparatus 100 has a twin-stage configuration are viewed from above.

Figure 4:
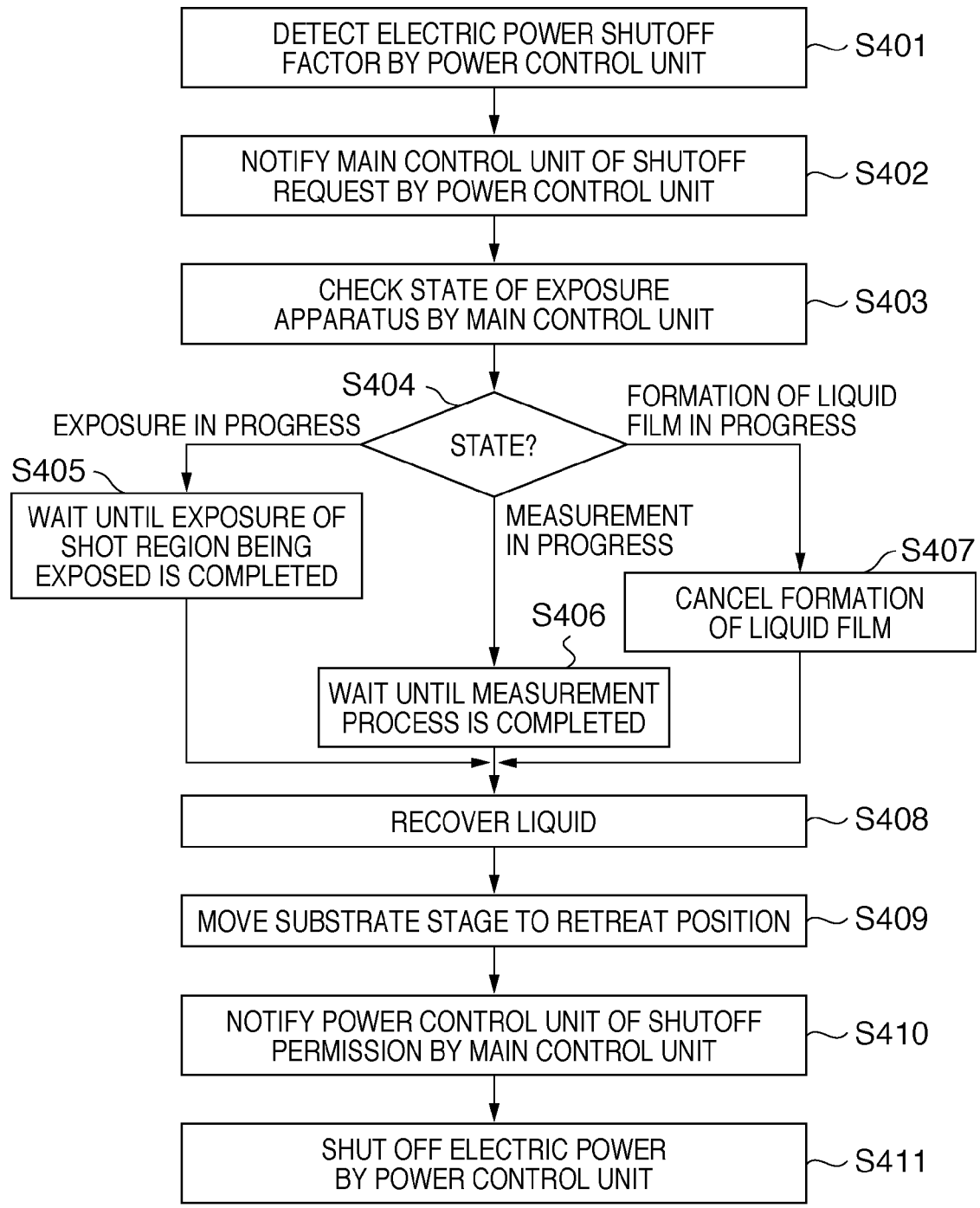
FIG. 4 is a flowchart illustrating the sequence of an electrical power shutoff process of shutting off electrical power supply to a substrate stage mechanism.

FIG. 4 is a flowchart illustrating the sequence of an electrical power shutoff process of shutting off electrical power supply to the substrate stage mechanism STM. The power control unit 65 can use a backup power supply capable of supplying electrical power sufficient to complete the electrical power shutoff process illustrated in FIG. 4 even when electrical power supply from the main power supply in the factory is shut off. The backup power supply can be, e.g., an auxiliary power supply provided to the immersion exposure apparatus 100 or that provided to the factory in which the immersion exposure apparatus 100 is installed.

In step S401, the power control unit 65 detects a factor due to which electrical power supply to the substrate stage mechanism STM is shut off. The factor includes, e.g., shutoff of electrical power supply from the main power supply in the factory, earthquake occurrence, a risk of a lightning strike, or a command to stop the operation of the immersion exposure apparatus 100 by the operator. One of the examples of the command to stop the operation of the immersion exposure apparatus 100 is a power off operation by a normal user interface switch.

In step S402, the power control unit 65 notifies the main control unit 22 of a shutoff request for requesting shutoff of electrical power supply to the substrate stage mechanism STM.

In step S403, the main control unit 22 checks a process being executed by the immersion exposure apparatus 100 (the state of the immersion exposure apparatus) when it has received the shutoff request. In step S404, the main control unit 22 determines a special process to be executed, in accordance with the process being executed by the immersion exposure apparatus 100. FIG. 4 shows three examples of the special process.

If the process being executed by the immersion exposure apparatus 100 when the main control unit 22 has received the shutoff request is an exposure process of continuously exposing a plurality of shot regions on the substrate 44, the main control unit 22 executes step S405 as the special process. More specifically, in step S405, the main control unit 22 ends the exposure process after waiting until the exposure of the shot region being exposed is completed.

If the process being executed by the immersion exposure apparatus 100 when the main control unit 22 has received the shutoff request is a measurement process for the substrate 44, the main control unit 22 executes step S406 as the special process. More specifically, in step S406, the main control unit 22 waits until the measurement process is completed. Note that the measurement process can include a measurement necessary to align the substrate 44 prior to the exposure process, typically, the position measurement of an alignment mark formed on the substrate stage 52 or substrate 44.

If the process being executed by the immersion exposure apparatus 100 when the main control unit 22 has received the shutoff request is a process of forming a liquid film in the space between the substrate 44 or substrate stage 52 and the projection optical system 2, the main control unit 22 executes step S407 as the special process. More specifically, the main control unit 22 stops the formation of a liquid film.

After the special process exemplified as step S405, S406, or S407, the main control unit 22 issues a command to the immersion unit IMU to recover the liquid 42 from above the substrate 44 or the substrate stage 52 in step S408. The liquid recovery can be done by, e.g., moving the substrate stage 52 so that a liquid recovery region 70 is positioned below the projection optical system 2, and operating the liquid recovery unit 40 in this state.

In step S409, the main control unit 22 controls the substrate stage mechanism STM to move the substrate stage 52 to a retreat position. The retreat position is a position at which a distance longer than that (working distance) between the substrate 44 and the projection optical system 2, while the substrate 44 is exposed, is ensured under the projection optical system 2. For example, in FIGS. 2 and 3, the retreat position can be the position of the substrate stage 52, at which a retreat region 110 is positioned below the projection optical system 2. Also, in the twin-stage configuration as illustrated in FIG. 3, the retreat position can be a position at which the two substrate stages 52-1 and 52-2 do not collide against each other.

In step S410, the main control unit 22 notifies the power control unit 65 of shutoff permission for permitting shutoff of electrical power supply to the substrate stage mechanism STM. In response to this notification, the power control unit 65 shuts off electrical power supply to the substrate stage mechanism STM in step S411.

If the substrate stage mechanism STM has a twin-stage configuration, as illustrated in FIG. 3, the above-described special process can be determined in accordance with the states of the two substrate stages 52-1 and 52-2. For example, in swapping the substrate stages 52-1 and 52-2, the liquid film on one substrate stage must often be moved onto the other substrate stage. In this case, it is determined whether the liquid film is moved onto either substrate stage, in accordance with the position or moving velocity of the liquid film.

Although the description above has been given assuming an immersion exposure apparatus of the local fill scheme, the present invention is also applicable to that of a scheme in which the entire substrate is immersed in the liquid.

A device manufacturing method according to a preferred embodiment of the present invention is suitable to manufacture, e.g., a semiconductor device and a liquid crystal device. This method can include a step of transferring the pattern of an original onto a photosensitive agent applied on a substrate using the exposure apparatus described above, and a step of developing the photosensitive agent. After these steps, other known steps (e.g., etching, resist removal, dicing, bonding, and packaging) are performed, thereby manufacturing devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An immersion exposure apparatus that projects a pattern of an original onto a substrate via a projection optical system and a liquid, thereby exposing the substrate, the apparatus comprising:
   a substrate stage mechanism including a substrate stage configured to hold the substrate;
   an immersion unit configured to supply the liquid into a space between the substrate or the substrate stage and the projection optical system, and to recover the liquid from above the substrate or the substrate stage; and
   a control unit configured to control said immersion unit to recover the liquid from above the substrate or the substrate stage, and then to control said substrate stage mechanism to move the substrate stage to a retreat position, in response to a shutoff request for requesting shutoff of electrical power supply to said substrate stage mechanism,
   wherein said control unit executes, in response to the shutoff request, a special process according to a process being executed by said immersion exposure apparatus when said control unit has received the shutoff request, and then controls said immersion unit to recover the liquid from above the substrate stage, and
   wherein if the process being executed by the immersion exposure apparatus when said control unit has received the shutoff request is an exposure process of continuously exposing a plurality of shot regions on the substrate, the special process includes ending the exposure process after waiting until the exposure of the shot region being exposed is completed.

2. The apparatus according to claim 1, wherein the retreat position includes a position at which a distance longer than a distance between the substrate and the projection optical system, while the substrate is exposed, is ensured under the projection optical system.

3. An immersion exposure apparatus that projects a pattern of an original onto a substrate via a projection optical system and a liquid, thereby exposing the substrate, the apparatus comprising:
   a substrate stage mechanism including a substrate stage configured to hold the substrate;
   an immersion unit configured to supply the liquid into a space between the substrate or the substrate stage and the projection optical system, and to recover the liquid from above the substrate or the substrate stage; and
   a control unit configured to control said immersion unit to recover the liquid from above the substrate or the substrate stage, and then to control said substrate stage mechanism to move the substrate stage to a retreat position, in response to a shutoff request for requesting shutoff of electrical power supply to said substrate stage mechanism,
   wherein said control unit executes, in response to the shutoff request, a special process according to a process being executed by said immersion exposure apparatus when said control unit has received the shutoff request, and then controls said immersion unit to recover the liquid from above the substrate stage, and
   wherein if the process being executed by the immersion exposure apparatus when said control unit has received the shutoff request is a measurement process for the substrate, the special process includes waiting until the measurement process is completed.

4. The apparatus according to claim 3, wherein the retreat position includes a position at which a distance longer than a distance between the substrate and the projection optical system, while the substrate is exposed, is ensured under the projection optical system.

5. A method of controlling an immersion exposure apparatus that comprises a substrate stage mechanism including a substrate stage that holds a substrate, and an immersion unit that supplies a liquid into a space between the substrate or the substrate stage and a projection optical system, and recovers the liquid from above the substrate or the substrate stage, and projects a pattern of an original onto the substrate via the projection optical system and the liquid, thereby exposing the substrate, the method comprising the steps of:
   positioning the liquid on the substrate to a liquid recovery region by driving the stage mechanism;
   recovering the liquid from above the substrate by the immersion unit in the liquid recovery region;
   moving the substrate stage to a retreat position by driving the stage mechanism;
   shutting off electrical power supply to the substrate stage mechanism; and
   executing a special process in accordance with a process being executed by the immersion exposure apparatus, wherein the special process includes a process of ending an exposure process after waiting until the exposure of a shot region being exposed is completed.

6. The method according to claim 5, further comprising a step of requesting a shutoff of electrical power supply to the substrate stage mechanism before positioning the liquid on the substrate to the liquid recovery region.

7. A method of controlling an immersion exposure apparatus that comprises a substrate stage mechanism including a substrate stage that holds a substrate, and an immersion unit that supplies a liquid into a space between the substrate or the substrate stage and a projection optical system, and recovers the liquid from above the substrate or the substrate stage, and projects a pattern of an original onto the substrate via the projection optical system and the liquid, thereby exposing the substrate, the method comprising the steps of:
   positioning the liquid on the substrate to a liquid recovery region by driving the stage mechanism;
   recovering the liquid from above the substrate by the immersion unit in the liquid recovery region;
   moving the substrate stage to a retreat position by driving the stage mechanism;
   shutting off electrical power supply to the substrate stage mechanism; and
   executing a special process in accordance with a process being executed by the immersion exposure apparatus, wherein the special process includes a process of waiting until a measurement process is completed.

8. The method according to claim 7, further comprising a step of requesting a shutoff of electrical power supply to the substrate stage mechanism before positioning the liquid on the substrate to the liquid recovery region.

* * * * *